United States Patent
Hurwitz

(10) Patent No.: US 10,523,166 B2
(45) Date of Patent: Dec. 31, 2019

(54) DIFFERENTIAL AMPLIFIER WITH MODIFIED COMMON MODE REJECTION, AND TO A CIRCUIT WITH AN IMPROVED COMMON MODE REJECTION RATIO

(71) Applicant: Analog Devices Global, Hamilton (BM)

(72) Inventor: Jonathan Ephraim David Hurwitz, Edinburgh (GB)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 15/616,062

(22) Filed: Jun. 7, 2017

(65) Prior Publication Data
US 2018/0358942 A1 Dec. 13, 2018

(51) Int. Cl.
*H03F 3/45* (2006.01)
*H03F 3/393* (2006.01)

(52) U.S. Cl.
CPC ......... *H03F 3/45717* (2013.01); *H03F 3/393* (2013.01); *H03F 3/45964* (2013.01); *H03F 3/45183* (2013.01); *H03F 3/45475* (2013.01); *H03F 3/45659* (2013.01); *H03F 2203/45008* (2013.01); *H03F 2203/45022* (2013.01); *H03F 2203/45068* (2013.01); *H03F 2203/45078* (2013.01); *H03F 2203/45418* (2013.01); *H03F 2203/45421* (2013.01); *H03F 2203/45424* (2013.01); *H03F 2203/45434* (2013.01); *H03F 2203/45528* (2013.01)

(58) Field of Classification Search
CPC ............. H03F 3/45183; H03F 3/45717; H03F 3/45215; H03F 1/34; H03F 3/45; H03F 3/45479; H03F 3/4565; H03F 3/45659; H03F 3/45475; H03F 3/45964; H03F 2203/45022; H03F 3/393; H03F 3/45964; H03F 2203/45418; H03F 2203/45078; H03F 2203/45068; H03F 2203/45008; H03F 2203/45528; H03F 2203/45434; H03F 2203/45424; H03F 2203/45421
USPC .................................................. 330/136, 258
See application file for complete search history.

(56) References Cited

U.S. PATENT DOCUMENTS

| | | | |
|---|---|---|---|
| 5,864,257 A | 1/1999 | Rothenberg | |
| 6,417,728 B1 * | 7/2002 | Baschirotto | H03F 3/45183 330/258 |
| 6,891,435 B2 * | 5/2005 | Patel | H03F 3/4556 330/149 |

(Continued)

OTHER PUBLICATIONS

Karki, James, "Fully-Differential Amplifiers", Texas Instruments—Application Report—SLOA054E—Jan. 2002—Revised Sep. 2016, Texas Instruments—Application Report—SLOA054E—Jan. 2002—Revised Sep. 2016, (Jan. 1, 2002), 28 pgs.

(Continued)

*Primary Examiner* — Khanh V Nguyen
(74) *Attorney, Agent, or Firm* — Schwegman Lundberg & Woessner, P.A.

(57) ABSTRACT

An amplifier circuit having improved common mode rejection is provided. This can be achieved by estimating the common mode value of an input signal and using this to adjust a target common mode voltage at the output of the amplifier. This can help avoid the differential gain becoming modified by the common mode voltage.

20 Claims, 14 Drawing Sheets

(56) References Cited

U.S. PATENT DOCUMENTS

| | | | | |
|---|---|---|---|---|
| 7,365,600 | B1* | 4/2008 | Lokere | H03F 3/45085 |
| | | | | 330/258 |
| 7,375,585 | B2* | 5/2008 | Trifonov | H03F 3/45219 |
| | | | | 330/258 |
| 7,893,766 | B1* | 2/2011 | Cranford, Jr. | H03F 1/3211 |
| | | | | 330/258 |
| 8,279,004 | B2* | 10/2012 | Wang | H03F 1/523 |
| | | | | 330/258 |
| 9,209,789 | B1* | 12/2015 | Li | H03K 5/02 |
| 2006/0091931 | A1 | 5/2006 | Leete | |
| 2011/0026180 | A1 | 2/2011 | Haible et al. | |
| 2018/0062583 | A1* | 3/2018 | Zhao | H03F 1/26 |

OTHER PUBLICATIONS

"European Application Serial No. 18176037.2 Extended Search Report dated Oct. 22, 2018", 8 pgs.

\* cited by examiner

DIFFERENTIAL AMPLIFIER WITH MODIFIED COMMON MODE REJECTION, AND TO A CIRCUIT WITH AN IMPROVED COMMON MODE REJECTION RATIO

The present disclosure relates to a differential amplifier having two outputs and an improved common mode rejection performance, wherein differences between the voltages at the output nodes are substantially unaffected by changes in a common mode input voltage.

BACKGROUND

It is known that differential amplifiers should receive first and second signals at their respective first and second inputs and to generate an output which is solely a function of the difference between the first and second signals. If the signals have a common mode component, then the value of this common mode component should not affect the output from an ideal differential amplifier.

However, in real devices component mismatch means that the devices deviate from the ideal response characteristic and that the output shows some dependence on the common mode input voltage. There is therefore a need to improve the performance of circuits using differential amplifiers. The amount by which a common mode input signal manifests itself as a change in the output signal is often referred to as the common mode rejection ratio. It is, in essence, a measure of how well the amplifier avoids mixing the common mode signal with the differential signal.

NOMENCLATURE

Often the term "amplifier" is used to refer to a circuit that provides gain. Sometimes the term is used to denote a circuit or gain block having a very high but not necessarily well controlled gain, such as an operational amplifier 2, as shown in FIG. 1a. Sometimes the term is used to encompass an arrangement where the gain block/operational amplifier 2 is provided inside a feedback loop where the overall gain of the amplifier is defined by the feedback loop, as shown in FIG. 1b.

Herein when we specifically wish to distinguish between the configurations shown in FIGS. 1a and 1b, then things like the arrangement of FIG. 1a will be referred to as gain block, and things like the arrangement of FIG. 1b will be referred to as "feedback defined amplifiers".

SUMMARY OF THE DISCLOSURE

According to a first aspect of the present disclosure there is provided a differential amplifier having a feed forward path for adjusting a target common mode output voltage as a function of the common mode component of the input signal.

The feed-forward path may be formed internally within a gain block or by components around the gain block.

The differential amplifier can comprise a gain block having a differential input and a differential output.

The gain of the differential amplifier can be set by a feedback network around the gain block.

The feedback network can be a resistor based network. However in other embodiments the feedback network may include other components in addition to or in place of resistors. The other components may be operated in continuous time (unswitched) or discrete time (switched) modes.

In an embodiment there is provided a resistor based feedback defined differential amplifier having a fully differential output, and having means for adjusting a target common mode output voltage to track changes in a common mode input signal.

A resistor based feedback defined differential amplifier has certain advantages, such as it operates in continuous time and can be configured to have a low input impedance. These features are not available with chopped amplifiers based on switched capacitor technologies. However such resistor based technologies are more susceptible to gain errors due to component mismatching. Resistors formed on an integrated circuit may still suffer from fabrication errors resulting from slight differences in the lithography, slight variations in the amount that they are etched or the amount of material deposited or other manufacturing errors. Furthermore such resistors may then be subject to thermal gradients as a result of the operation of the circuit in which they are placed which means that the resistors might, in use, operate at different temperatures. Furthermore, the process of packaging an integrated circuit can stress the silicon die which can also give rise to changes in resistance of supposedly matched resistors. All these affects can give rise to a resistive mismatch in the gain setting network around a resistor controlled differential amplifier. A resistance mismatch of a relatively modest amount can give rise to significant reduction in the common mode rejection ratio of the amplifier.

Advantageously the gain block, for example an operational amplifier, is associated with a circuit which modifies the target output common mode voltage as a function of the input common mode voltage. The circuit may also apply a voltage so as to shift the voltage domain (common mode voltage) between the input and output voltage ranges of the differential amplifier.

According to a second aspect of this disclosure there is provided a method of improving the linearity of a differential amplifier in the presence of a common mode input signal component, the differential amplifier having a control node for controlling a target common mode output voltage of a differential output of the amplifier, the method comprising feeding forward a control signal to the target common mode voltage control node as a function of the input common mode voltage.

Although the issues of component mismatch in the context of adversely affecting the common mode rejection performance, i.e. converting the common mode signal into a differential signal component, will be discussed in detail with respect to feedback defined amplifiers where the feedback loop is primarily defined by resistors, the same issues arise where the feedback loop is defined by capacitors or other components.

BRIEF DESCRIPTION OF THE DRAWINGS

Embodiments of the present disclosure will now be described, by way of non-limiting example only, with reference to the accompanying drawings, in which.

DESCRIPTION OF SOME EMBODIMENTS

Figure 1A:
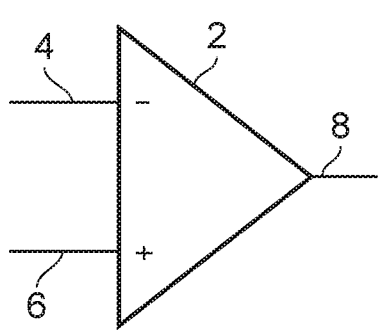
FIG. 1a schematically represents a gain block in the form of a differential operational amplifier having a single output.

FIG. 1a schematically illustrates the circuit diagram for a differential amplifier having a single output. As known to the person skilled in the art the differential amplifier 2 has an inverting input 4 and a non-inverting input 6. The difference between those inputs is gained up by the internal gain of the amplifier 2 and the output is provided at a voltage at a single output 8. Typically the internal gain of the amplifier is in the order often thousand to ten million times or more. In order to make amplifiers having their modest gains, a feedback loop generally comprising first and second resistors is provided as known to the person skilled in the art.

Figure 1B:
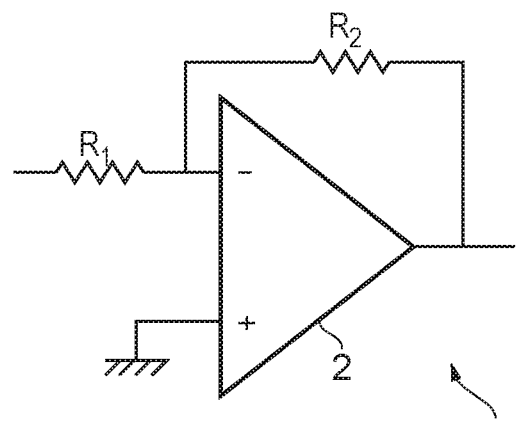
FIG. 1b illustrates the use of the differential operational amplifier within a feedback defined amplifier circuit.

FIG. 1b shows the provision of a feedback loop formed by resistors R1 and R2 around the operational amplifier/gain block 2 such that the resistors define the gain of the amplifier, generally designated 10.

Figure 2:
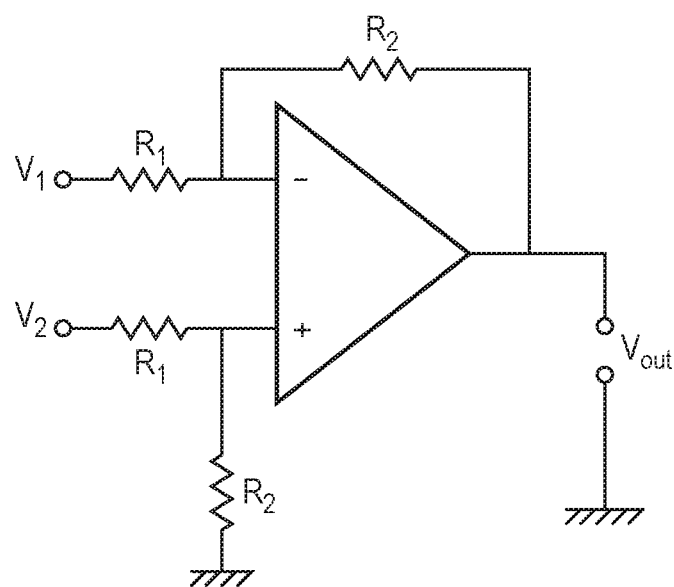
FIG. 2 schematically illustrates a circuit for a feedback defined differential amplifier with a single output.

The circuit arrangement of FIG. 1b can be modified as shown in FIG. 2 to provide a differential amplifier which accepts input voltage V1 and V2 and provides a single output voltage Vout. The ratio of the resistor $$\frac{R_1}{R_2}$$

associated with each input set the gain of the amplifier. If there is a mismatch in the ratios then a change in a common mode voltage Vcm propagates through the amplifier to look like a change resulting from a change to the differential input voltage.

Figure 3A:
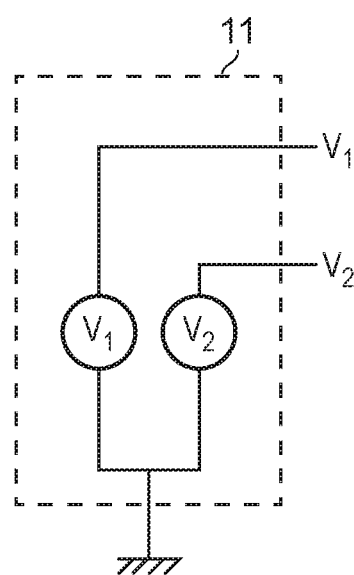
FIGS. 3a and 3b illustrate a circuit equivalence between two representations of voltages V1 and V2 to illustrate how a common mode voltage is defined.
Figure 3B:
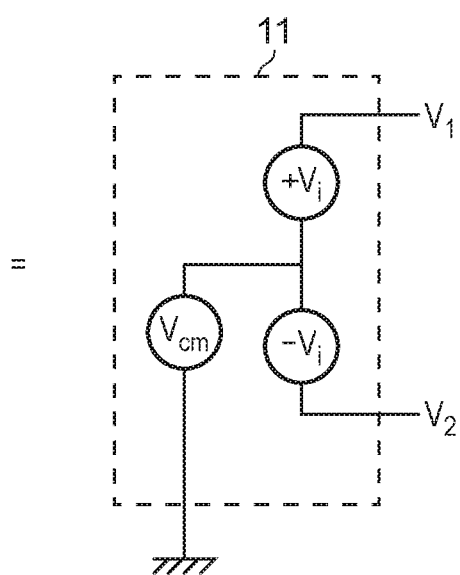

As shown in FIG. 3a, the voltage V1 and V2 can be regarded as originating from a signal source 11 comprising first and second voltage sources V1 and V2 referenced to a common node, such as ground. However an equivalent representation is shown in FIG. 3b where a voltage source provides a common mode voltage Vcm representing the average of V1 and V2, and then a further voltage Vi is added to it to create V1 and the same voltage Vi is subtracted from Vcm to make V2.

In an ideal differential feedback defined amplifier $$dVout = \frac{R_2}{R_1} \cdot d(V2 - V1)$$

and $$\frac{dVout}{dVcm} = 0$$

For convenience V1 and V2 will be referred to Vin_ and Vin_+.

Considering the amplifier of FIG. 2 in greater detail, its common mode rejection ratio could be tested by shorting Vin_ to Vin_+ and then sweeping that input over a voltage range. Ideally the output voltage Vout would not change as the common mode input voltage swept over the input range. In general one can write an equation linking the change in output voltage to the change in input voltages in terms of a common mode gain Gcm and a differential gain Gdiff. The gain is written in small signal form (changing output voltage versus change in input voltage) as opposed to the ratio of the input and output voltages as the difference amplifier may also be used to perform a voltage translation to its input and output domains. Thus the gain could be written as $$\Delta V_0 = Gdiff(\Delta Vin_+ - \Delta Vin_-) + \frac{1}{2}Gcm(\Delta Vin_+ + \Delta Vin_-)$$

$$CMRR = \frac{Gdiff}{|Gcm|}$$

The common mode rejection ratio, CMRR, can then be expressed as the ratio of these terms in decibels.

$$CMRR = 10\log_{10}\left(\frac{Gdiff}{Gcm}\right)^2 dB \qquad \text{Equation 1}$$

$$CMRR = 20\log_{10}\left(\frac{Gdiff}{|Gcm|}\right) dB$$

The common mode rejection ratio is an important amplifier parameter. One approach of using a differential amplifier is to reject common mode signals such that a common mode voltage, or rather the target common mode voltage, at the output of the amplifier is unchanging, i.e. Gcm tends to zero.

However, as will be shown later this approach of thinking about common mode rejection is disadvantageous in the context of some differential dual ended (e.g. two inputs and two outputs) amplifier designs.

Figure 4:
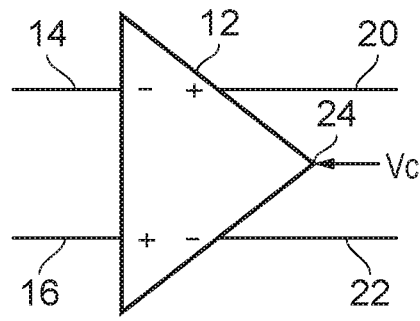
FIG. 4 schematically illustrates the circuit diagram for a fully differential amplifier, namely one having differential inputs and differential outputs.

Differential amplifiers having dual ended (differential outputs) also can be provided. FIG. 4 schematically illustrates the symbol for such an amplifier. Here the amplifier generally designated 12 has an inverting input 14 and a non-inverting input 16 and provides signals on first and second outputs 20 and 22. Such an amplifier also generally includes an output voltage common mode control terminal 24. The output voltage common mode control terminal 24 receives a common mode target voltage which is used to control the amplifier such that the average of the signals from the first and second outputs 20 and 22 matches the voltage supplied at common mode target voltage setting input pin/node 24.

For convenience, it is worth considering how the differential input stage of the amplifier 2 shown in FIG. 1a is modified in broad terms to arrive at the amplifier shown in FIG. 4.

Figure 5:
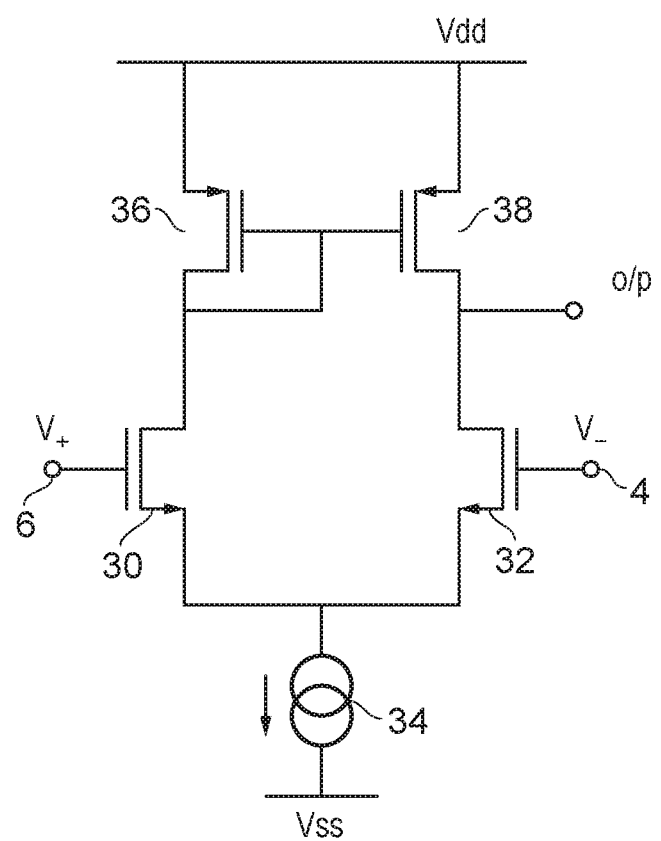
FIG. 5 schematically shows a simplified circuit diagram of a single stage differential amplifier as the type shown in FIG. 1 for the purposes of introducing the modifications made to such an amplifier to make it fully differential.

FIG. 5 shows a simplified example of a single stage differential amplifier gain block having a single ended output, i.e. it represents one possible embodiment of the circuit shown in FIG. 1.

Figure 6:
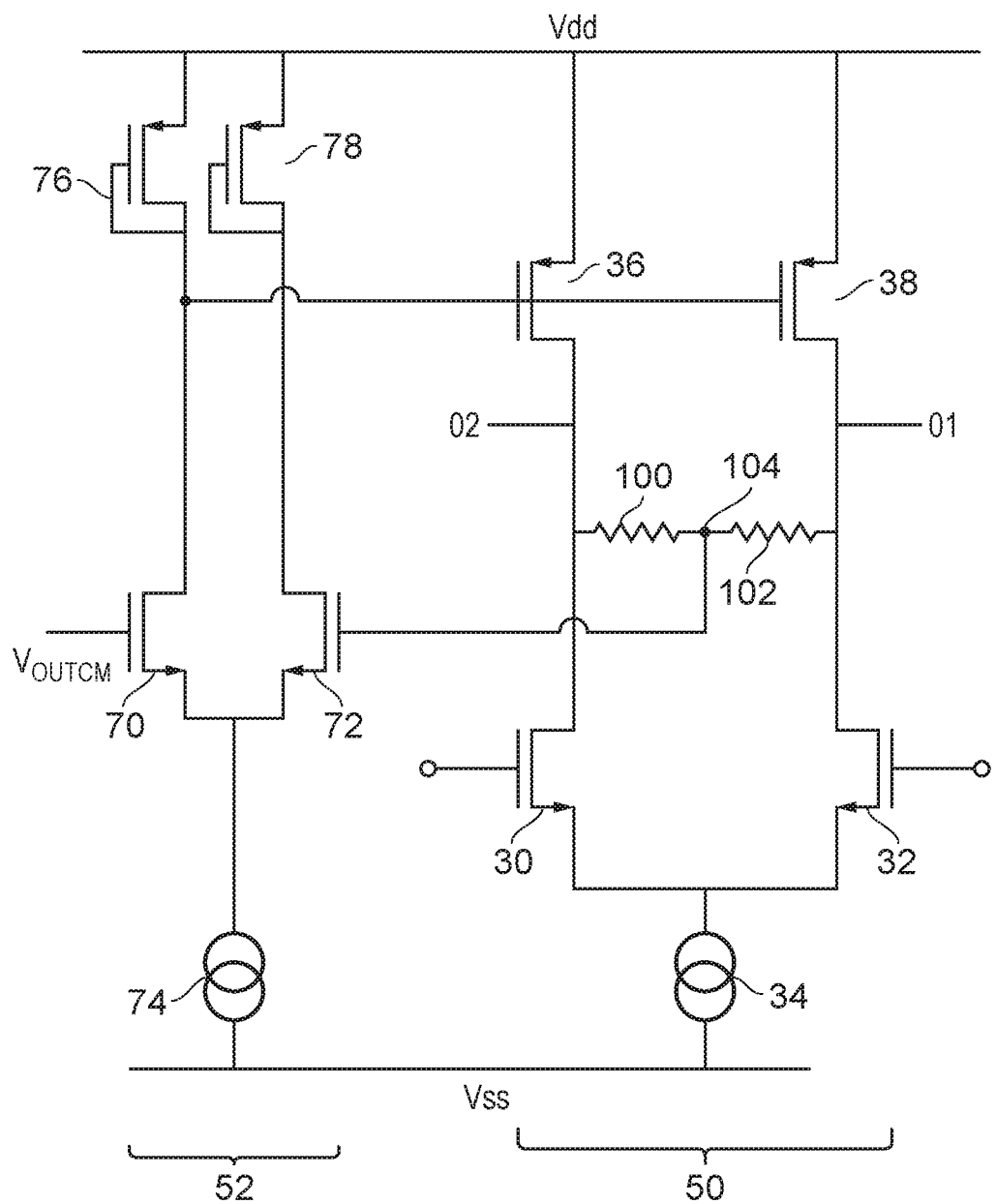
FIG. 6 schematically illustrates a simplified circuit diagram of a fully differential amplifier including a common mode output voltage controller.

The circuit shown in FIG. 5 comprises first and second N-type MOSFET transistors 30 and 32 having their sources connected together and to a current sink 34. The gate of the first transistor 30 acts as the non-inverting input 6 and the gate of the second transistor 32 acts as the inverting input 4. The transistors pass current through respective active loads which in this example are formed by two P-type MOSFETs 36 and 38. Each of the P-type MOSFETs 36 and 38 have their source terminal connected to the positive supply rail $V_{dd}$. The gates are also connected together. The drain of the transistor 36 is connected to the drain of the transistor 30. The drain of transistor 38 is connected to the drain of transistor 32. The drain of transistor 36 is also connected to the gates of the transistors 36 and 38. Thus transistor 36 is in a "diode connected" configuration and the current passing through it is mirrored by transistor 38. An output signal is derived from the drain of transistor 38. Thus the arrangement shown in FIG. 5 has a differential input and a single ended output. This circuit can easily be modified as shown in FIG. 6 to provide a differential output. The arrangement shown in FIG. 6 sets out the circuit diagram of an embodiment of the amplifier 12 of FIG. 4. The circuit comprises a differential amplifier gain block, generally designated 50 but based on the arrangement shown in FIG. 5, together with an error amplifier generally designated 52.

Comparing FIG. 6 with FIG. 5 it can be seen that the first and second N-type transistors 30 and 32 still have their sources connected to the current sink 34. Furthermore the transistors 30 and 32 are still in series with P-type transistors 36 and 38. The P-type transistors 36 and 38 still have sources connected to $V_{dd}$ and they still have their gates connected together. However, transistor 36 is no longer diode connected and instead both transistors 36 and 38 receive a shared control signal from the error amplifier 52. A first output node O1 is still formed at the drain of transistor 32. However a new differential output node designated O2 is now formed at the drain of transistor 30.

In principle if all the transistors were completely matched, then the transistors 36 and 38 could be biased to a fixed voltage and an amplifier having a differential input and a differential output would result. However such an arrangement is not stable in the face of component or temperature variation and has the potential to lock up. Therefore in order to control the common mode output voltage, and indeed to enable the common mode output voltage to be set to a desired value some further components are provided. The further components are in the form of a differential error amplifier 52. It comprises a differential input stage comprising N-type transistors 70 and 72 which have their sources connected together and to a current sink 74. Each of the transistors 70 and 72 has a load connected between its drain and the positive supply rail $V_{dd}$. In principle the load can be formed by resistors but it is more convenient for loads to be formed by diode connected P-type MOSFETs 76 and 78. The gates of the P-type MOSFET transistors 36 and 38 are connected to an error amplifier output node 80 formed at the drain of the N-type transistor 70. The target common mode output voltage Voutcm can be supplied to the gate of the first transistor 70 of the error amplifier 52. The instantaneous common mode voltage of the outputs O1 and O2 of the amplifier 50 are provided to the gate of a second transistor 72 of the error amplifier 52. The common mode voltage is formed by placing a resistive potential divider between the outputs nodes O1 and O2. The potential divider comprises resistors 100 and 102 which are of equal value. Thus the resistors form an average of the output voltages at O1 and O2 at a node 104 between resistors 100 and 102 and connected to the gate of the transistor 72. The resistors values are selected to be moderately large such that they do not adversely affect the operation of the amplifier 50.

If the common mode voltage of the outputs O1 and O2 is above Voutcm then it can be seen that more current flows to a transistor 72 and less current flows through transistor 70. This causes the voltage of the drain of the transistor 70 to rise and therefore the gate voltages of the transistor 36 and 38 also rise. This in turn causes them to act as current sources passing a reduced amount of current. The current flowing through the amplifier stage 50 as a whole is set by the current sink 34 and hence the voltage at nodes O1 and O2 tends to fall. Similarly if the common mode output voltage is too low then transistor 70 tends to pass more current than transistor 72 and as a result its drain voltage decreases. This in turn causes transistors 36 and 38 to pass more current allowing the voltages at the nodes O1 and O2 to be increased. Thus the function of the circuit is to act as a differential amplifier where the difference between the voltages of the gates 30 and 32 is amplified and presented at the output nodes O1 and O2 but where the output common mode voltage at nodes O1 and O2 corresponds to the voltage Voutcm as set at the input to transistor 70. Other amplifier topologies are known and the internal configuration of the differential gain block is not part of the inventive concept set out in this disclosure.

Figure 7:
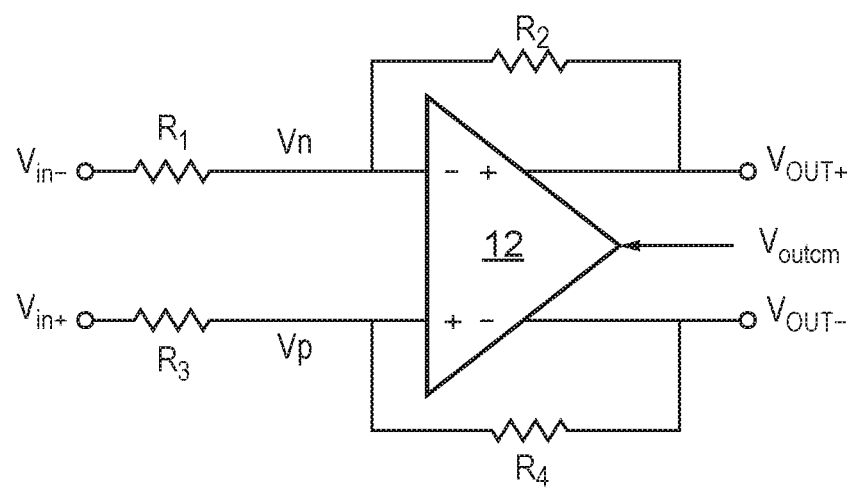
FIG. 7 illustrates a circuit diagram of a feedback defined amplifier where the gain of the amplifier is set by resistors R1 to R4 of a feedback network and the output common mode voltage is controlled by a voltage fed to the common mode control terminal of the amplifier.

The differential input differential output amplifier of FIG. 5 and FIG. 6 is generally connected within a circuit arrangement as shown in FIG. 7 where the differential gain is set by the interaction of resistors R1 and R2 and R3 and R4.

As will be shown below, the operation of the feedback defined amplifier shown in FIG. 7 is similar to the operation of single ended operational amplifiers known to the person skilled in the art, and as illustrated in FIG. 1b. However there are some nuances in the circuit design and in particular the effect of component mismatch, i.e. the ratio of resistor R2 to R1 being slightly different to the ratio of resistor R4 to R3. This, as might be expected, gives rise to a change in the differential gain of the amplifier. However, as will also be shown, it gives rise to a degradation in the common mode rejection ratio of the amplifier.

The inventor realized that an improved common mode rejection could be achieved by deliberately modifying the target common mode output voltage. This is true even though the change in common mode output voltage is larger than in certain other systems, and on the basis of the way that engineers may think about common mode rejection the circuits disclosed herein look as if they have a reduced CMRR.

In embodiments of this disclosure, the common mode input signal value is formed and is deliberately fed forward to the target output common mode voltage control node in order to vary the target common mode voltage at the output of the amplifier. This behavior is counterintuitive as it would be expected to degrade the amplifier performance rather than improve it as it results in the common mode gain tending towards unity. However, as will be shown below, the actual performance of a dual ended differential input amplifier is quite complex and the subtleties of its operation are often overlooked or simply not appreciated by engineers.

Circuit analysis of a fully differential amplifier is similar to that of a normal single output differential amplifier, except that it is significantly more difficult.

Some additional complexity arises due to the additional feedback paths.

Using the nodes identified in FIG. 7, then
For the voltage Vn we can see that $$Vn = Vin_-\left(\frac{R2}{R1+R2}\right) + Vout_+\left(\frac{R1}{R1+R2}\right) \quad \text{Equation 2}$$

Similarly $$Vp = Vin_+\left(\frac{R4}{R3+R4}\right) + Vout_-\left(\frac{R3}{R3+R4}\right) \quad \text{Equation 3}$$

For ease of writing the equations, let $$\alpha = \frac{R1}{R1+R2} \quad \text{Equation 4}$$

$$\beta = \frac{R3}{R3+R4} \quad \text{Equation 5}$$

Hence we can rewrite Vn and Vp as $$Vn = Vin_-(1-\alpha) + Vout_+\cdot\alpha \quad \text{Equation 6}$$

$$Vp = Vin_+(1-\beta) + Vout_-\cdot\beta \quad \text{Equation 7}$$

We can also introduce the differential gain of the amplifier as G(f)

$$Vout_+ - Vout_- = G(f)(Vp - Vn) \quad \text{Equation 8}$$

Combining Equations 6 and 7 with Equation 8

$$Vout_+(1+G(f)\alpha) - Vout_-(1+G(f)\beta) = G(f)\{Vin_+(1-\beta) - Vin_-(1-\alpha)\} \quad \text{Equation 9}$$

This is still cumbersome, but further progress can be made by noting that $$\tfrac{1}{2}(Vout_+ + Vout_-) = Voutcm \quad \text{Equation 10}$$

so $$Vout_- = 2Voutcm - Vout_+ \quad \text{Equation 11}$$

Now we can rewrite equation 9 as $$Vout_+(2 + G(f)\beta + G(f)\alpha) - 2Voutcm(1 + G(f)\beta) = \quad \text{Equation 12}$$

$$G(f)\{Vin_+(1-\beta) - Vin_-(1-\alpha)\}$$

or $$Vout_+ = (\alpha+\beta)^{-1} \cdot \left(Vin_+(1-\beta) - Vin_-(1-\alpha) + 2Voutcm\left(\frac{1}{G(f)} + \beta\right)\right) \cdot \left(1 + \frac{2}{G(f)\alpha + G(F)\beta}\right)^{-1}$$

Using the normal assumptions of very high gain within the gain block such that $$G(f)\alpha \gg 1 \text{ and } G(f)\beta \gg 1$$

then Equation 12 can be reduced to $$Vout_+ = \frac{Vin_+(1-\beta) + Vin_-(1-\alpha) + 2Voutcm\beta}{(\alpha+\beta)} \quad \text{Equation 13}$$

similarly $$Vout_- = \frac{-[Vin_+(1-\beta) - Vin_-(1-\alpha)] + 2Voutcm\,\alpha}{(\alpha+\beta)} \quad \text{Equation 14}$$

If we define the output differential signal as $$Vout\_diff = Vout_+ - Vout_- \quad \text{Equation 15}$$

then $$Vout\_diff = \frac{2[Vin_+(1-\beta) - Vin_-(1-\alpha)] + 2Voutcm(\beta-\alpha)}{(\alpha+\beta)} \quad \text{Equation 16}$$

If the resistors are matched, such that R1=R3 and R2=R4 then α=β. This allows simplification of Equation 16 since if α=β then the term "2Vout(β−α)" always evaluates to zero. Assume the resistors are perfectly matched so that we can replace β by α, so $$Vout\_diff = \frac{2[Vin_-(1-\alpha) - Vin_-(1-\alpha)]}{2\alpha} \quad \text{Equation 17}$$

so $$Vout\_diff = \frac{(1-\alpha)}{\alpha}(Vin_+ - Vin_-) \quad \text{Equation 18}$$

hence $$Vout\_diff = \frac{R2}{R1}(Vin_+ - Vin_-) \quad \text{Equation 19}$$

However we can also see that if there is a small mismatch, say by a factor of 0.001 such that β=1.001α, then two things can be observed.

1) Firstly the differential gain charges slightly as the first portion of Equation 16 becomes $$Vout\,diff = \frac{2[Vin_+(1 - 1\cdot001\alpha) - Vin_-(1-\alpha)]}{2\cdot001\alpha} \quad \text{Equation 20}$$

Thus there is a gain error that is proportional to $Vin_+ - Vin_-$ and independent of the common mode voltage.

2) The second portion of Equation 16 no longer evaluates to zero, i.e.

$$\frac{2Voutcm(\beta - \alpha)}{(\beta + \alpha)} \neq 0 \qquad \text{Equation 21}$$

in this example $$\frac{\beta - \alpha}{\beta + \alpha} = \frac{0.001\alpha}{2.001\alpha} = 0.0005$$

thus the differential gain has a component that varies with the common mode output voltage.

$$Vout\_diff = 0.0005 Voutcm \qquad \text{Equation 22}$$

Now it can be observed that the input signals $Vin_+$ and $Vin_-$ can be related to each other by introducing a common mode input voltage Vincm and an input differential voltage Vindiff.

$$\therefore Vin_+ = Vincm + \tfrac{1}{2} Vindiff$$

$$Vin_- = Vincm - \tfrac{1}{2} Vindiff \qquad \text{Equation 23}$$

If we return to Equation 20 and rewrite using Equation 23

$$Voutdiff = \frac{2}{2.001\alpha}\left\{\left[\left(Vincm + \tfrac{1}{2}Vindiff\right)(1 - 1.001\alpha)\right] - \left[\left(Vincm - \tfrac{1}{2}Vindiff\right)(1 - \alpha)\right]\right\} \qquad \text{Equation 24}$$

which can be expanded to $$Vout\_diff = -2Vincm \cdot \frac{0.001\alpha}{2.001\alpha} - 2Vindiff \frac{0.001\alpha}{2.001\alpha} \qquad \text{Equation 25}$$

It can be seen that the mismatch at the inputs introduce a gain error due to the common mode component which in turn can be considered as giving rise to an error voltage Verror at the outputs.

$$Verror = -2 Vincm \times 0.0005 \qquad \text{Equation 26}$$

This can be compared with the worked example of the modification as a result of the output common mode voltage from Equation 22

$$Vout\_diff(error) = 0.0005 \times Voutcm$$

It can be seen that the effect resistor of mismatch can be reduced if the input common mode voltage is fed forward and used to adjust the target common mode voltage at the output.

Figure 8:
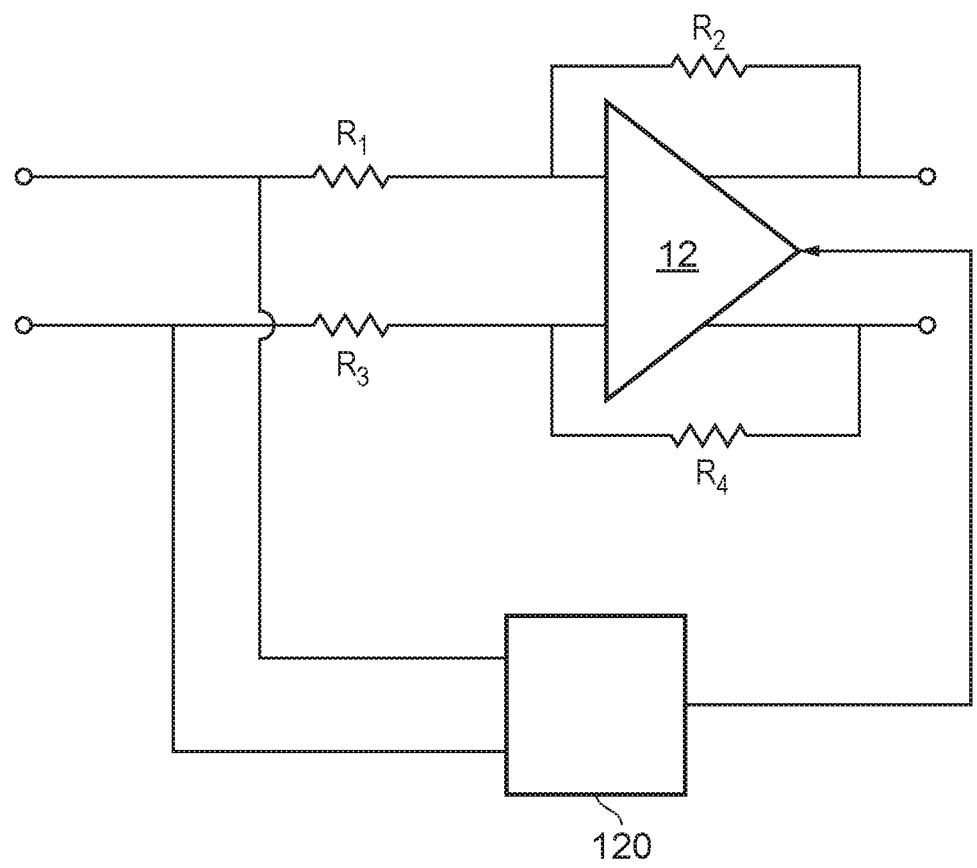
FIG. 8 schematically illustrates an amplifier where the common mode input voltage is used to modify the target common mode output voltage in accordance with teachings of this disclosure.

FIG. 8 schematically illustrates an embodiment of this disclosure in which the arrangement shown in FIG. 7 is adapted by the inclusion of a common mode input voltage feed forward circuit 120. The common mode feed forward circuit 120 receives an indication of the input signals $Vin_-$ and $Vin_+$ and uses them to form a modified output voltage common mode target value Voutcm.

In the discussion of FIG. 2, and with the aid of FIGS. 3a and 3b it was noted that in an ideal differential feedback defined amplifier.

$$\frac{dVout}{dVcm} = 0$$

The present inventor has realized that in the presence of component mismatch it is better to allow an effective common mode gain to approach unity.

This however, at first sight gives rise to a degraded common mode rejection radio using the definitions of Equation 1, even though it reduces the mixing of the differential output signal component with the common mode output signal component.

Figure 9:
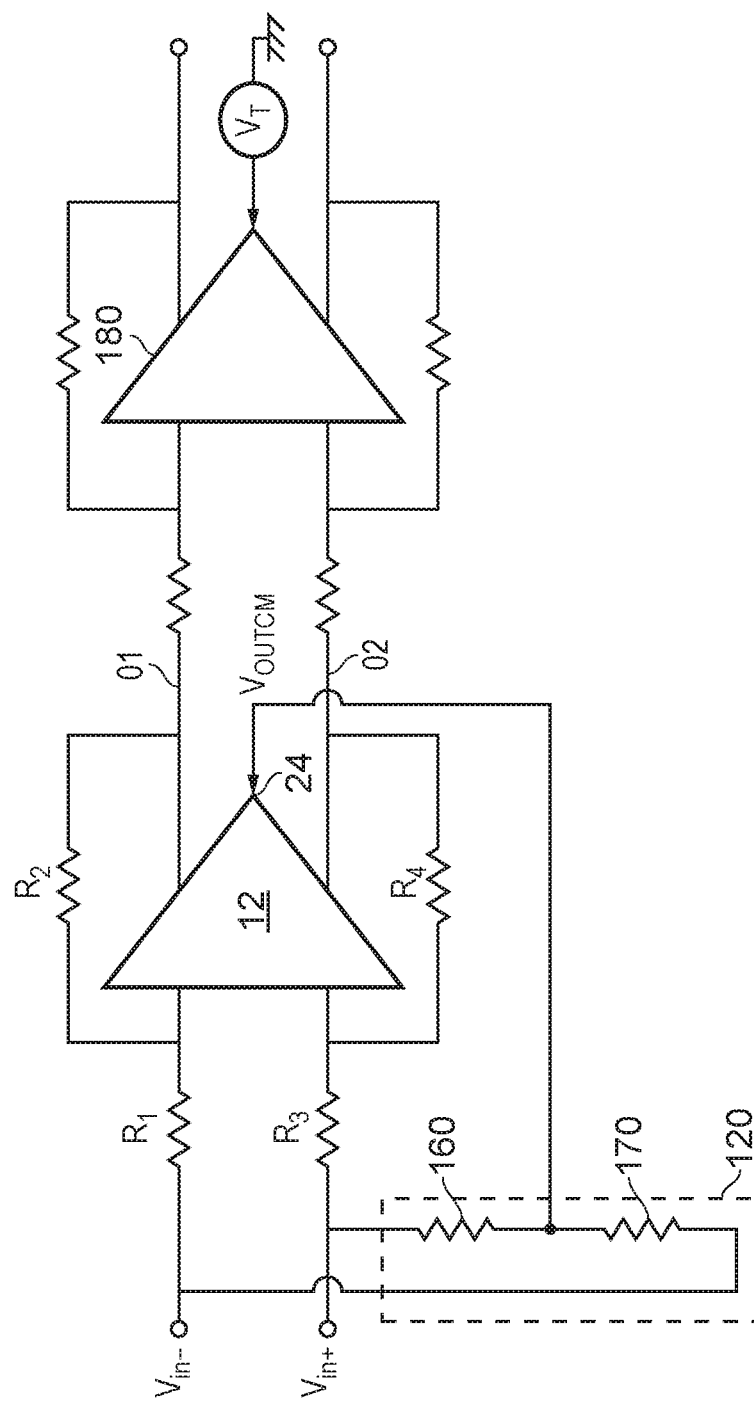
FIG. 9 shows an embodiment of a two stage amplifier where the first stage common mode voltage control based on the common mode input voltage.

FIG. 9 schematically illustrates an arrangement in which the offset voltage tracking circuit 120 merely comprises first and second resistors 160 and 170 which act to form an estimate of the common mode voltage signal at the signal inputs $Vin_+$ and $Vin^-$ of the circuit. Here the common mode estimate of the input voltage is fed directly to the amplifier's target common mode output voltage control pin 24. Thus, as opposed to other circuits where this is a DC value, the arrangement shown in FIG. 9 the signal supplied to the output voltage common mode control pin is deliberately varying.

However, as will be appreciated by the preceding analysis, this approach reduces the impact of the common mode voltage and the differential gain at the outputs O1 and O2 even if it results in a common mode variation of those voltages. Thus an attempt has not been made to fix the common mode voltage at the outputs to a static value but instead it is deliberately allowed to wander as a function of the common mode input voltage. This approach improves the common mode rejection performance of the amplifier.

The amplifier stage can be followed by a further amplifier 180 having its own common mode output voltage control terminal which in this instance may be set to a static, i.e. substantially unchanging, voltage $V_T$. Thus the second amplifier stage 180 can undertake the task of transforming the differential output voltage into a domain where it has a known and fixed common mode output component. Alternatively, the second stage 180 may also be provided with a variable common mode output target value. The second stage may or may not be followed by a third stage which might also have a variable common mode voltage output target value or may have a fixed value.

There is a choice of how much of the common mode input voltage signal is feed forward to the amplifier's output voltage common mode control pin. Thus the variation between the input common mode voltage and a desired output common mode target may be formed and that variation may be forwarded in its entirety or merely in part. Such a choice may be made to trade off common mode rejection against amplifier headroom.

The disclosed technique passes on the common mode signal to be handled later in the chain, but if the gain stage has a positive gain, for example say of 100, then the CMRR limitation of the next element in the chain when input referred to before this invention has effectively improved by a factor of 100, as the differential signal has been amplified, but the common mode signal gain has remained unity.

It is thus possible to provide an improved differential amplifier with significantly improved common mode rejection ratios. In testing an amplifier having an inherent common mode rejection ratio of 60 dB was modified by the feed forward circuit to exhibit an effective common mode rejection ratio of limited by the common mode rejection ratio of the ADC measuring the output which had around −120 dB CMRR.

Figure 10:
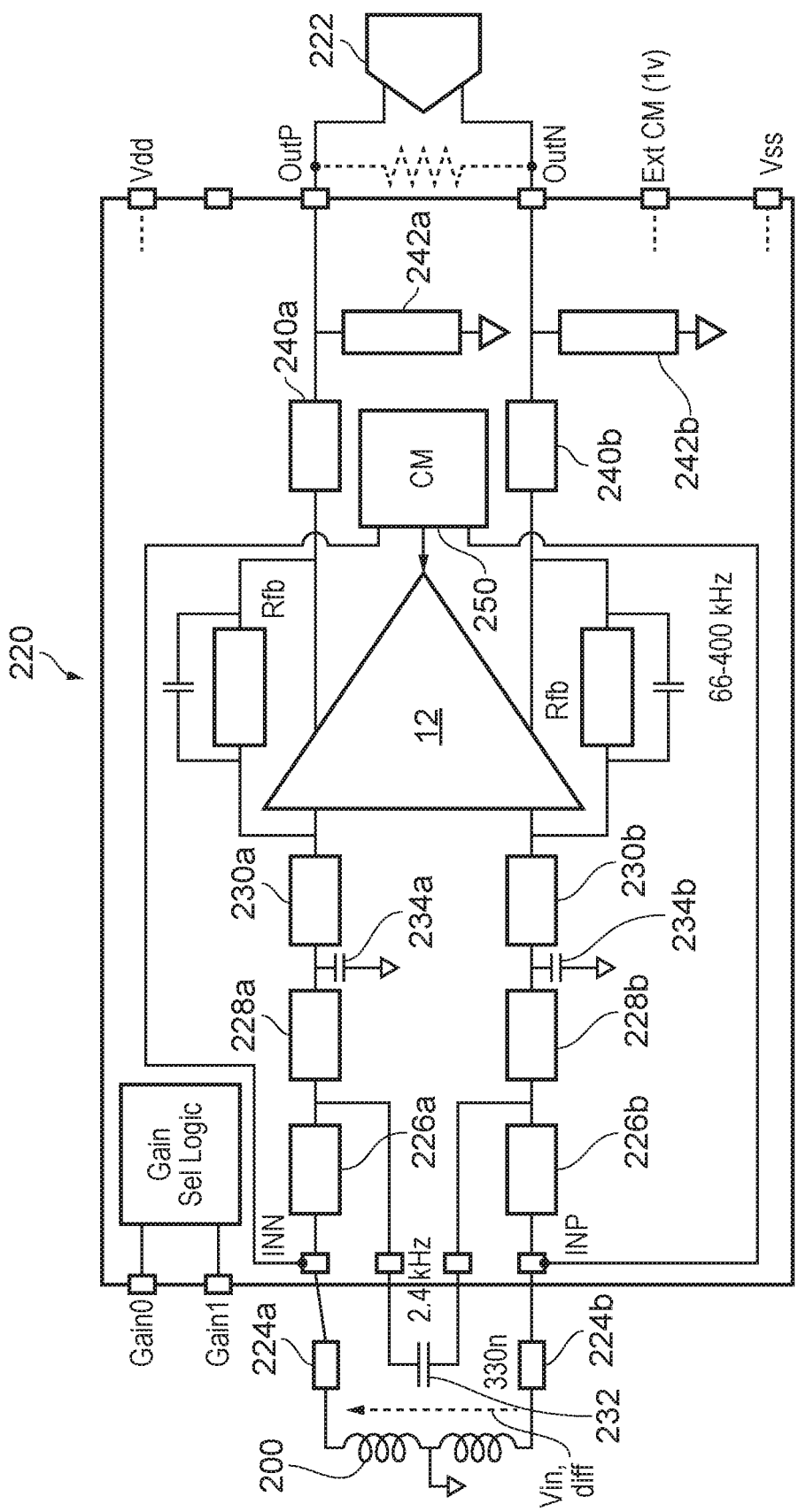
FIG. 10 shows a measurement system in conjunction with an amplifier constituting an embodiment of this disclosure.

FIG. 10 shows an example of an amplifier in accordance with the teachings of this disclosure receiving a signal from a differential Rogowski type coil 200. The amplifier generally designated 220 amplifies the differential signal from the Rogowski coil 200 and supplies it to a differential analog to digital converter 222. The amplifier 220 is configured as an inverting amplifier and its gain set by the ratio of its input resistance to the feedback resistances.

In this scenario the input resistance comprises at least two resistors one of which $R_C$ is the resistance of the respective coil of the differential Rogowski coil sensor. The or each other resistor may be an on-chip resistor which advantageously has a lower temperature coefficient resistance than that of the Rogowski coil. The at least one other resistor has a resistance $R_{in}$. In the example shown in FIG. 10 the coil resistance is represented by resistors 224a and 224b. The on-chip input resistance in this example is formed by three series connected resistors 226a, 228a and 230a with similar resistors designated "b" in the other channel of the differential amplifiers. Capacitors 232, 234a and 234b are coupled to the nodes between each pair of the resistors so as to provide low pass filtering. The low pass filtering is important because the response of the Rogowski coil depends on $$\frac{dI}{dt}$$

and hence has a high pass response. Low pass filtering protects the input stage from being overdriven or saturated in the presence of high frequency harmonics in the current being measured. The filters also provide an anti-aliasing function.

In this example the output nodes of the amplifier are connected to resistors 240a and 240b which at as the major contribution in defining the amplifier output resistance. The output resistors can form a potential divider with resistors 242a and 242b connected to ground in order to level shift and attenuate the output, while alternatively a single resistor can be connected between resistors 242a and 242b.

Furthermore, the input signals at nodes INN and INP are provided to a common mode controller 250 which, as described hereinbefore, could simply be two resistors forming a potential divider. The common mode controller 250 sets the target common mode output voltage of the amplifier 12. Thus this circuit can take a small input signal from the Rogowski coil sensor and amplify it whilst also exhibiting enhanced immunity to common mode signals. Although the common mode output voltage may not be static due to the action of the common mode controller 250, the differential analog to digital converter 252 can deal with that feature of the output of the amplifier and provide an output code which is independent of the common mode output voltage from the amplifier 12.

The configuration of resistors described herein also forms two potential dividers which can act to reduce the gain of the amplifier slightly as the temperature increases. Explicitly, if the temperature coefficients of the resistors on-chip are less than the temperature coefficient resistance of the coil, then the overall amplifier gain decreases or at least can be arranged to decrease slightly as the temperature increases.

This effect can be used to compensate for thermal expansion of a substrate carrying the Rogowski coil or of the coil itself. The increasing volume of the coil as a function of temperature means that the output voltage of the coil for a given magnetic field acting at the coil also increases with increasing temperature. Thus these two effects can be balanced out. Thus the circuit shown in FIG. 9 can provide some temperature compensation for gain as the volume of the sensor coil increases as well as providing for improved common mode rejection.

The amplifier need not be limited to measuring currents by way of the voltage developed across a Rogowski coil. The input could come from shunt resistors, capacitive sensors, biomedical sensors or indeed any sensors having a differential output. Similarly the amplifier response does not need to be a low pass filter response, and gain adjustment as a function of temperature as described above need not be performed.

Figure 11:
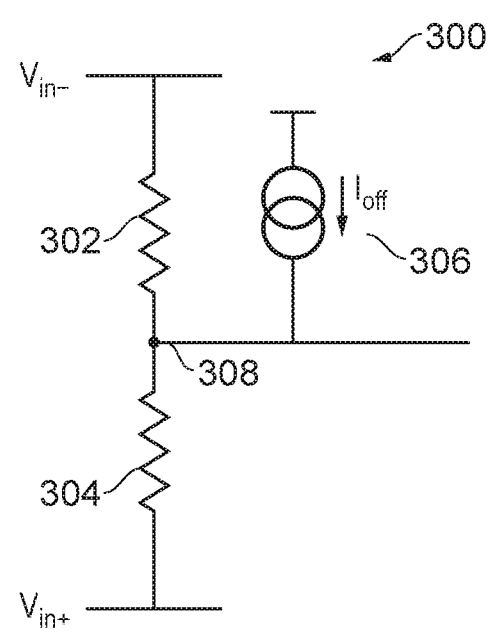
FIG. 11 is a circuit diagram of an input common mode voltage tracking circuit including an offset generator.

FIG. 11 illustrates a further variation of a common mode voltage feed forward circuit 300 to be included within block 120 which allows for an offset to be included. An offset may be useful when the input and the output need to be at different levels, for example the sensor may be at ground and the designer may wish the output voltage to be centered around VDD/2 to maximize signal swing. Resistors 302 and 304 are arranged in series between the input nodes Vin_ and Vin_+ so as to form a potential divider. However in order to provide an offset of the current source (or current sink) 306 is also provided and connected to a node 308 between the resistor 302 and 304. Resistors 302 and 304 have an equal value of Rcm and the voltage offset amounts to 0.5 Rcm Ioff.

Figure 12:
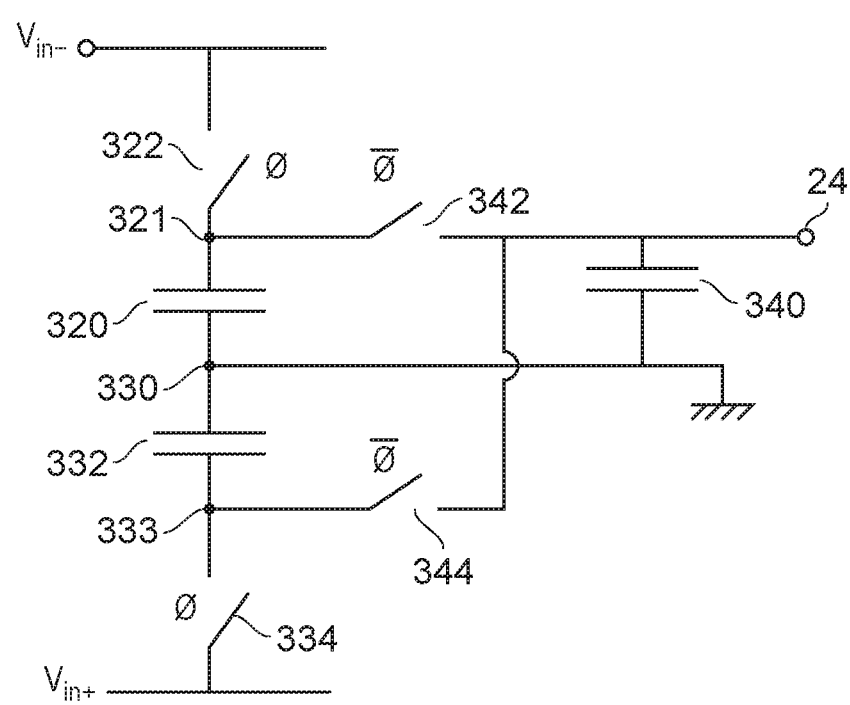
FIG. 12 is a circuit diagram of a switched capacitor based input common mode voltage tracking circuit.

Input common mode voltage estimating circuits may also be formed using capacitors as shown in FIG. 12. Here a first sampling capacitor 320 is in series connection with a first sampling switch 322 between a first one of the inputs, for example Vin_ and a reference node 330 which may be held at a local ground. Similarly a second sampling capacitor 332 is provided in series with a second sampling switch 334 between the other input, for example Vin_+ and the reference node 330. The switches 322 and 332 are driven by a suitable switch control signal, such as a square wave or similar derived from a clock. A further capacitor 340 can be selectively connected to a node 321 intermediate the first capacitor 320 and its switch 322 by way of a further switch 342. Similarly the capacitor 340 can also be connected to a node 333 intermediate the second sampling capacitor 332 and the sampling switch 334 by way of switch 344. The switches 322 and 334 are driven on a first phase of a control clock φ so as to sample the input signals Vin_ and Vin_+ onto the sampling capacitors. The switches 342 and 344 can be regarded as charge transfer switches which are driven in anti-phase with the sampling switches 322 and 334. Thus, in a first phase of operation the switches 322 and 334 close so as to sample the input voltages onto the capacitors 320 and 332. In a second phase of operation the sampling switches open and the charge transfer switches 342 and 344 close such that charge redistributes between the sampling capacitors 330 and 332 and a common mode voltage storage capacitor 340. Repeated operation of the circuit results in the voltage across the capacitor 340 representing the common mode voltage of the inputs Vin_ and Vin_+. The capacitor 340 is connected to the common mode output voltage node 24.

Figure 13:
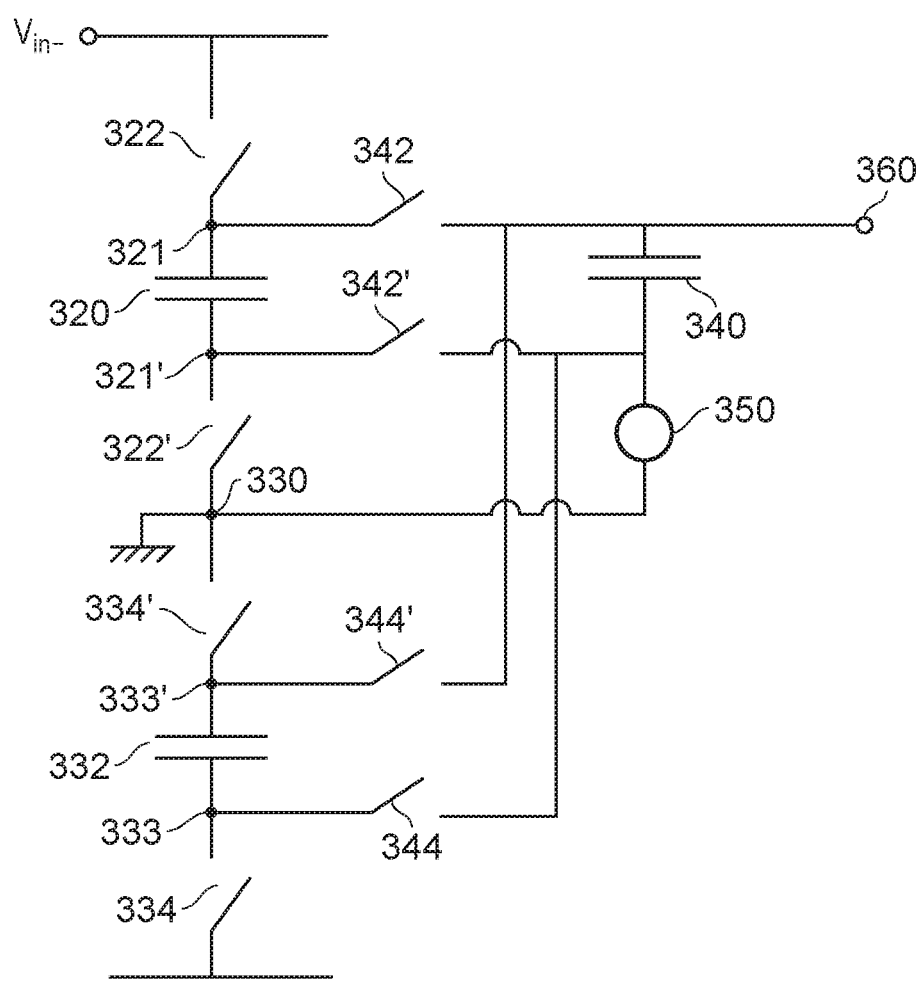
FIG. 13 shows how the circuit of FIG. 12 may be arranged to add an offset voltage.

The arrangement shown in FIG. 12 can be modified to add an offset voltage from an offset voltage generator 350. Such an arrangement is shown in FIG. 13. Like parts are designated with like reference numerals. It can be seen, by comparing FIGS. 12 and 13, that the circuit of FIG. 12 is modified by the inclusion of extra sampling switches 322' and 334' between the respective sampling capacitors 320 and 332 and the reference node 330. Additionally extra charge transfer switches 342' and 344' are now provided to connect the lower plate of the storage capacitor 340 to circuit nodes 321' formed between the first sampling capacitor 320 and the sampling switch 322' and also to node 333' formed between the second sampling capacitor 332 and the additional sampling switch 334'. These additional switches allow the sampling capacitors 320 and 332 to be completely isolated from the signal path such that when they charge share with the storage capacitor 340 they are also floating such that an additional voltage provided by the voltage generator 350 can impressed upon the output voltage provided at output node 360.

Figure 14:
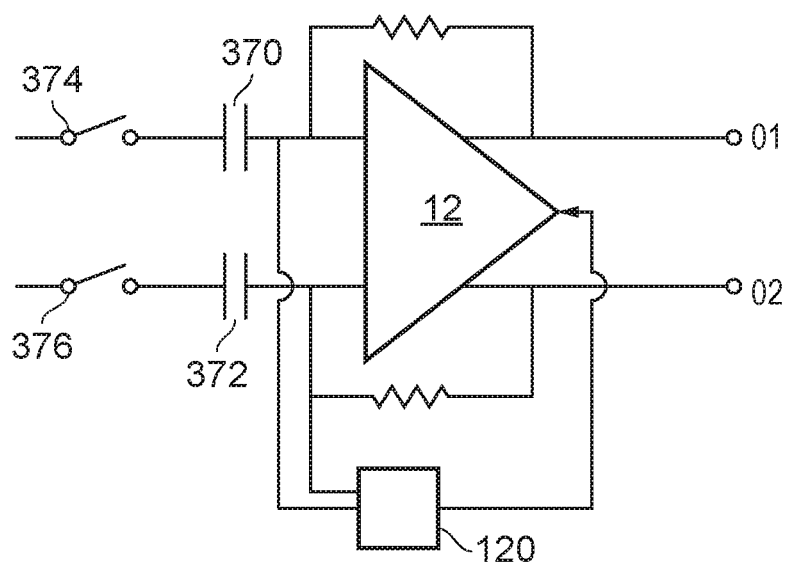
FIG. 14 shows a further embodiment of a feedback defined amplifier operating in accordance with the teachings of this disclosure.
Figure 15:
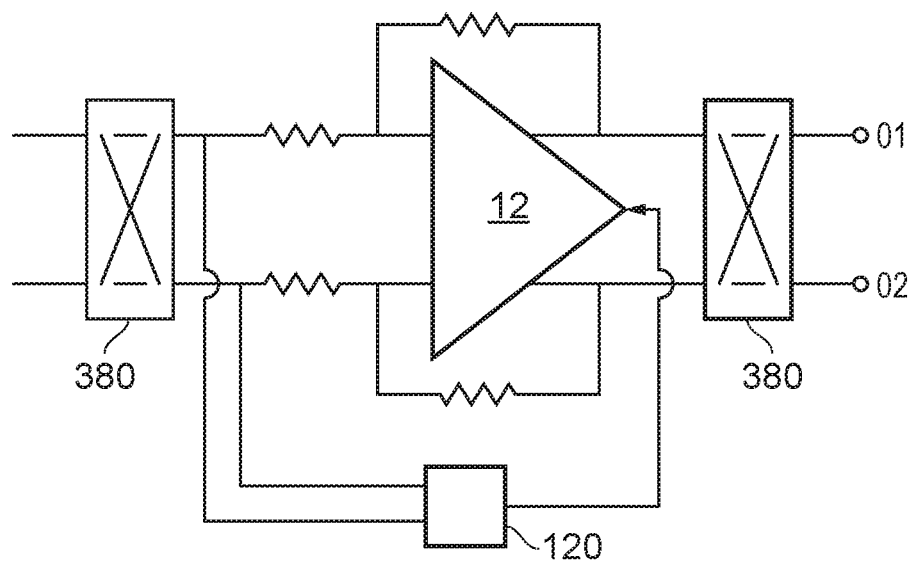
FIG. 15 shows a further embodiment of a feedback defined amplifier operating in accordance with the teachings of this disclosure.

The amplifier, such as the arrangement of FIG. 8, need not be a feedback defined amplifier where the feedback components only comprise resistors. Thus, as shown in FIG. 14 the input resistors R1 and R3 have been replaced by capacitors 370 and 372. The capacitors may or may not be provided with sampling switches 374 and 376. This is a choice whether the input is to be continuously sampled or discretely sampled. Similarly, the feedback resistors may also be replaced by capacitors and/or resistor and capacitor combinations thereby giving a filter response. Similarly, the feedback defined amplifier may be provided with input and output chopping circuits as shown in FIG. 15. The operation of the chopping circuits 380 allows the inputs and outputs to be swapped from side to side within the amplifier so as to reduce the effects of internal amplifier offsets. The common mode estimation circuit 120 could equally be before the first chop switches 380, as opposed to after them.

Figure 16:
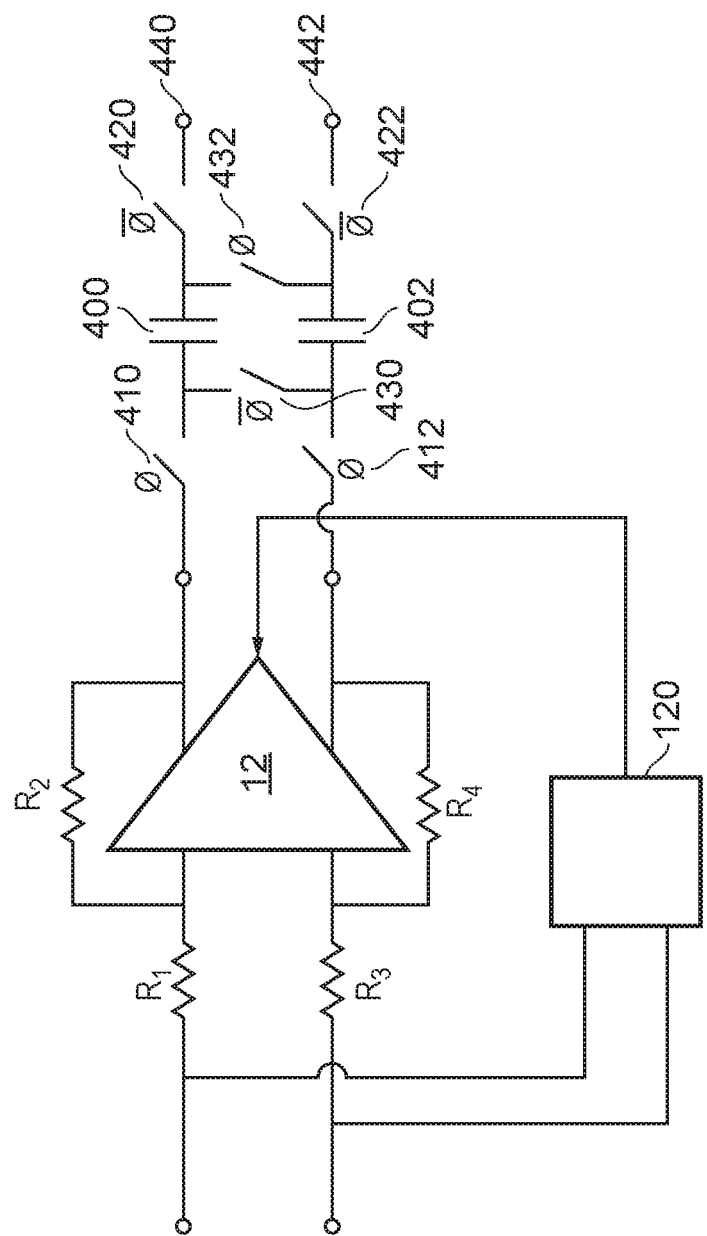
FIG. 16 shows a further embodiment with a discrete time common mode voltage modification circuit following the fully differential amplifier.

As noted before the common mode voltage at the output of the amplifier 12 varies more in systems in accordance with the present disclosure compared to prior art amplifier arrangements. However this variation avoids corruption of the differential gain by factors depending on the common mode voltage. It is therefore beneficial to follow the amplifier by circuits which have good common mode rejection ratios thereby allowing the voltage to be reliably translated to a fixed common mode reference voltage. This can be achieved by a relatively simple capacitor sampling circuit as shown in FIG. 16. Here capacitors 400 and 402 are provided in series with the output nodes O1 and O2 of the amplifier 12. The capacitors are preceded by input sampling switches 410 and 412 and followed by output gating switches 420 and 422. The switch 420 operates in anti-phase with the switch 410. Similarly the switch 422 operates in anti-phase with the switch 412. The switches 410 and 412 are active (low impedance) when a clock signal φ is asserted and the switches 420 and 422 are active when the signal φ is not asserted. Shorting switches 432 are provided either side of the capacitors 400 and 402. Switch 430 is open circuit when the switches 410 and 412 are closed. Similarly switch 432 is open circuit when the switches 420 and 422 are closed. Operation of the switches allows the common mode component from the output of the amplifier 12 to be rejected. Furthermore if either of the output nodes 440 and 442 are held at a fixed voltage then the action of the charge sharing around the capacitors is such that the voltage at the other node for example 440, represents only the gained up differential voltage from the input nodes to the amplifier 12. It is thus possible to mitigate the effect of component mismatch within the feedback defined amplifier.

The embodiments described herein are, as noted before, not intending to be limiting and features of one embodiment may be combined with features of another.

The claims presented herein are in single dependency format suitable for filing at the USPTO. However it is to be understood that each dependent claim can be dependent on one or more preceding claims unless that is clearly technically infeasible.

The invention claimed is:

1. A fedback defined differential amplifier comprising:
an impedance network coupled to a gain block, wherein a gain of the differential amplifier is set by the impedance network coupled to the gain block; and
a target output common mode voltage input node of the gain block configured to receive, via a feed forward path, an input signal to set a target common mode output voltage of the differential amplifier, wherein the gain block is configured to generate a common mode voltage at an output of the differential amplifier as a function of the received input signal that represents a common mode signal at differential inputs of the differential amplifier, and wherein the target common mode output voltage is configured to track changes in the common mode signal at the differential inputs.

2. The feedback defined differential amplifier as claimed in claim 1, wherein a common mode input voltage is formed using a potential divider within the feed forward path.

3. The feedback defined differential amplifier as claimed in claim 2, wherein the potential divider comprises resistors.

4. The feedback defined differential amplifier as claimed in claim 2, wherein a current source is used to modify the output of the potential divider.

5. The feedback defined differential amplifier as claimed in claim 2, wherein the potential divider comprises switched capacitors.

6. The feedback defined differential amplifier as claimed in claim 1, wherein the differential amplifier is a continuous time differential amplifier.

7. The feedback defined differential amplifier as claimed in claim 1, wherein the gain block has a first input, a second input, a first output and a second output, and where a first input node is connected to the first input by a first resistor (R1) of the impedance network, the first input is connected to the first output by a second resistor (R2) of the impedance network, a second input node is connected to the second input by a third resistor (R3) of the impedance network and the second input is connected to the second output by a fourth resistor (R4) of the impedance network, and wherein the ratios of the resistor sizes control the differential gain of the amplifier.

8. The feedback defined differential amplifier as claimed in claim 1, in combination with a second amplifier arranged to receive the output from the differential amplifier, wherein the second amplifier has a substantially static target common mode output voltage.

9. The feedback defined differential amplifier as claimed in claim 1, in combination with a differential analog to digital converter.

10. The feedback defined differential amplifier as claimed in claim 1, in combination with a circuit for converting the output to a single ended output.

11. The feedback defined differential amplifier as claimed in claim 1, in combination with a differential current measurement circuit comprising a differential current sensor providing first and second signal to inputs of the differential amplifier.

12. The feedback defined differential amplifier as claimed in claim 11, in combination with the differential current measurement circuit comprising a $$\frac{dI}{dt}$$

transducer.

13. The feedback defined differential amplifier as claimed in claim 12, in combination with the differential current measurement circuit including a differentially coupled Rogowski coil.

14. The feedback defined differential amplifier as claimed in claim 1, in combination with a current measurement circuit including a current sensor including a shunt, and the differential amplifier is responsive to a voltage difference developed across the shunt.

15. A method of improving the common mode rejection performance of a feedback defined differential amplifier having an impedance network coupled to a gain block and having a control node for controlling a target common mode output voltage of a differential output of the differential amplifier, wherein a gain of the differential amplifier is set by the impedance network coupled to the gain block, the method comprising:
   feeding forward a control signal to the target common mode voltage control node of the gain block to set the target common mode output voltage of the differential amplifier; and
   generating a common mode voltage at the output of the differential amplifier as a function of the control signal that represents a common mode signal at differential inputs of the differential amplifier,
   wherein the target common mode output voltage is configured to track changes in the common mode signal at the differential inputs.

16. The method as claimed in claim 15, in which a portion of the common mode signal is used to form the target common mode output voltage.

17. The method as claimed in claim 15, in which all of the common mode signal is used to form the target common mode output voltage.

18. The method as claimed in claim 15, further comprising adding a fixed voltage to the signal used to form the target common mode output voltage so as to perform voltage domain transformation.

19. A feedback defined differential amplifier comprising:
   an impedance network coupled to a gain block, wherein a gain of the differential amplifier is set by the impedance network coupled to the gain block; and
   a target output common mode voltage input node of the gain block configured to receive, via a feed forward path, an input signal to set a target common mode output voltage of the differential amplifier; and
   means for generating a common mode voltage an output of the differential amplifier as a function of the received input signal that represents a common mode signal at differential inputs of the differential amplifier,
   wherein the target common mode voltage is configured to track changes in the common mode signal at the differential inputs.

20. The feedback defined differential amplifier of claim 19, in combination with a differential analog to digital converter.

* * * * *

UNITED STATES PATENT AND TRADEMARK OFFICE
CERTIFICATE OF CORRECTION

PATENT NO.           : 10,523,166 B2
APPLICATION NO.      : 15/616062
DATED                : December 31, 2019
INVENTOR(S)          : Jonathan Ephraim David Hurwitz Page 1 of 1

It is certified that error appears in the above-identified patent and that said Letters Patent is hereby corrected as shown below:

In the Claims

In Column 14, Line 8, in Claim 1, delete "fedback" and insert --feedback-- therefor In Column 14, Line 44, in Claim 7, delete "network" and insert --network,-- therefor Signed and Sealed this
Fourth Day of August, 2020

Andrei Iancu
*Director of the United States Patent and Trademark Office*